US008907310B2

(12) United States Patent
Bowering et al.

(10) Patent No.: US 8,907,310 B2
(45) Date of Patent: Dec. 9, 2014

(54) EUV OPTICS (71) Applicant: Cymer LLC, San Diego, CA (US)

(72) Inventors: Norbert R. Bowering, Bielefeld (DE); Igor V. Fomenkov, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/049,957

(22) Filed: Oct. 9, 2013

(65) Prior Publication Data

US 2014/0176926 A1    Jun. 26, 2014

Related U.S. Application Data (62) Division of application No. 12/927,063, filed on Nov. 5, 2010, now Pat. No. 8,598,549, which is a division of application No. 11/505,177, filed on Aug. 16, 2006, now Pat. No. 7,843,632.

(51) Int. Cl.
*H05G 2/00* (2006.01)
*G03F 7/20* (2006.01)
*G02B 5/08* (2006.01)
*G02B 7/182* (2006.01)

(52) U.S. Cl.
CPC .............. *G03F 7/7015* (2013.01); *G02B 7/182* (2013.01); *G02B 5/0891* (2013.01)
USPC ................. 250/504 R; 250/492.1; 250/492.2; 250/492.3

(58) Field of Classification Search
CPC ............ G03F 7/70266; G02B 26/0841; G02B 26/0825; G02B 26/0833; G02B 7/185; Y10S 359/904
USPC ................................. 250/492.1–492.3, 504 R
See application file for complete search history.

(56) References Cited

U.S. PATENT DOCUMENTS

| 6,765,712 B2 | 7/2004 | Van Dijsseldonk et al. |
| 6,880,942 B2 | 4/2005 | Hazelton et al. |
| 2011/0001947 A1* | 1/2011 | Dinger et al. ................... 355/67 |

FOREIGN PATENT DOCUMENTS

| EP | 1365263 | 11/2003 |
| JP | 8-068897 | 3/1996 |
| JP | 2000-162414 | 6/2000 |
| JP | 2002083767 | 3/2002 |
| JP | 2003-329820 | 11/2003 |
| JP | 2004056125 | 2/2004 |

OTHER PUBLICATIONS

Japanese Office Action dated Apr. 30, 2012 corresponding to Japanese Application No. 2009-524601.

* cited by examiner

*Primary Examiner* — Michael Maskell
(74) *Attorney, Agent, or Firm* — Arent Fox LLP (57) ABSTRACT

In a first aspect, a method of fabricating an EUV light source mirror is disclosed which may comprise the acts/steps of providing a plurality of discrete substrates; coating each substrate with a respective multilayer coating; securing the coated substrates in an arrangement wherein each coated substrate is oriented to a common focal point; and thereafter polishing at least one of the multilayer coatings. In another aspect, an optic for use with EUV light is disclosed which may comprise a substrate; a smoothing layer selected from the group of materials consisting of Si, C, $Si_3N_4$, $B_4C$, SiC and Cr, the smoothing layer material being deposited using highly energetic deposition conditions and a multilayer dielectric coating. In another aspect, a corrosion resistant, multilayer coating for an EUV mirror may comprise alternating layers of Si and a compound material having nitrogen and a $5^{th}$ period transition metal.

31 Claims, 7 Drawing Sheets

EUV OPTICS

CROSS-REFERENCED TO RELATED APPLICATIONS

This application is a Divisional of U.S. application Ser. No. 12/927,063, filed Nov. 5, 2010, which is a Divisional of U.S. application Ser. No. 11/505,177, filed Aug. 16, 2006, now U.S. Pat. No. 7,843,632, issued Nov. 30, 2010, the disclosure of each of these prior applications being hereby incorporated in their entirety by reference.

This application is related to U.S. patent application Ser. No. 11/174,299 filed on Jun. 29, 2005 and entitled, LPP EUV LIGHT SOURCE DRIVE LASER SYSTEM, U.S. Pat. No. 6,625,191 granted on Sep. 23, 2003 and entitled, VERY NARROW BAND, TWO CHAMBER, HIGH REP RATE GAS DISCHARGE LASER SYSTEM and U.S. Pat. No. 6,549,551 granted on Apr. 15, 2003 and entitled, INJECTION SEEDED LASER WITH PRECISE TIMING CONTROL and U.S. Pat. No. 6,567,450 granted on Apr. 20, 2003 and entitled, VERY NARROW BAND, TWO CHAMBER, HIGH REP RATE GAS DISCHARGE LASER SYSTEM, the entire contents of which are hereby incorporated by reference herein.

FIELD

The present disclosure relates to extreme ultraviolet (EUV) light generators providing EUV light from a plasma created from a source material and collected and directed to a focus for utilization outside of the EUV light source generation chamber, e.g., for semiconductor integrated circuit manufacturing photolithography e.g., at wavelengths of around 50 nm and below.

BACKGROUND

EUV light, e.g., electromagnetic radiation having wavelengths of around 50 nm or less (also sometimes referred to as soft x-rays) and including light at a wavelength of about 13.5 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, indium, antimony, tellurium, aluminum, etc. with an emission line in the EUV range. In one such method, often termed laser-produced plasma (LPP) the required plasma can be produced by irradiating a target material, such as a droplet, stream or cluster of material having the required line-emitting element, with a laser beam.

Once generated, the EUV light is typically reflected by a multi-layer mirror, sometimes called a collector mirror. For example, in one setup, a normal incidence elliptical reflector may be used having an aperture to allow laser light to pass through and reach the target material at an irradiation site. In one arrangement, a collector in the shape of a prolate ellipsoid may be positioned such that its first focus is located at the irradiation site and its second focus is positioned at a so-called intermediate point (also called the intermediate focus) where the EUV light may be output from the light source and input to, e.g., an integrated circuit lithography tool.

Some lithography tools utilize an arc field illumination field to efficiently irradiate the tool's photomask/reticle. For example, see U.S. Pat. No. 6,210,865 entitled "EXTREME-UV LITHOGRAPHY CONDENSOR" which issued to Sweatt et al on Apr. 3, 2001, the contents of which is hereby incorporated by reference herein. Thus, for this type of tool, the EUV light generated at the plasma irradiation site may need to be collected, condensed and shaped to create the arc field. Typically, for EUV light, reflective optics, e.g., grazing and/or normal incidence mirrors, are used, with each reflection resulting in an in-band intensity loss of about 20-40%. Thus, it may be desirable to use as few optics as possible between the plasma irradiation site and the photomask/reticle.

Another factor that is often considered when designing a high volume EUV light source is the generation and mitigation of debris which may damage EUV light source optics such as a laser input window, collector mirror and/or metrology equipment. Thus, for at least some source materials, the production of a plasma may also generate undesirable by-products in the plasma chamber, (e.g., debris) which can potentially damage or reduce the operational efficiency of the various plasma chamber optical elements. This debris can include out-of-band photons, high energy ions and scattered debris from the plasma formation, e.g., atoms and/or clumps/microdroplets of source material. This debris may also include chamber material from secondary sputtering and for the case of electric discharge type systems, electrode material. For this reason, it is often desirable to employ one or more techniques to minimize the types, relative amounts and total amount of debris formed for a given EUV output power. When the target size, e.g., droplet diameter, and/or target makeup, e.g., chemistry, are chosen to minimize debris, the targets are sometimes referred to as so-called "mass limited" targets.

The high energy ions and/or source material debris may be damaging to the optical elements in a number of ways, including heating them, coating them with materials which reduce light transmission, penetrating into them and, e.g., damaging structural integrity and/or optical properties, e.g., the ability of a mirror to reflect light at such short wavelengths, corroding or eroding them and/or diffusing into them. Thus, debris reduction and/or suitable techniques to reduce the impact of debris may need to be considered in the design of a high volume EUV light source.

One way to reduce the influence of debris is to move the collector mirror away from the irradiation site. This, in turn, implies the use of a larger collector mirror to collect the same amount of light. The performance of a collector mirror, e.g., the ability to accurately direct as much in-band light as possible to, e.g., a focal point, depends of the figure and surface finish, e.g., roughness of the collector. As one might expect, it becomes more and more difficult to produce a suitable figure and surface finish as the size of the collector mirror grows. Typically, these EUV collector mirrors have included a monolithic substrate overlaid with a multilayer dielectric coating, e.g., Mo/Si. Depending on the application, these multilayer mirrors may also include thin barrier layers deposited at one or more interfaces and in some cases can include a capping layer. Collector mirror substrate requirements may include one or more of the following: vacuum compatibility, mechanical strength, e.g. high temperature strength, high thermal conductivity, low thermal expansion, dimensional stability, ability to be polished to a suitable figure and finish, and the ability to be brazed or bonded.

With the above in mind, Applicants disclose EUV optics including collector mirrors, corresponding fabrication methods, and methods of use.

SUMMARY

In a first aspect, a method of fabricating an EUV light source mirror is disclosed which may comprise the acts/steps of providing a plurality of discrete substrates; securing the substrates in an arrangement wherein each substrate is oriented to a common focal point; and thereafter polishing at least one of the substrates and coating each the substrate with a respective EUV reflective multilayer coating. The mirror may be a normal incidence mirror or a grazing incidence mirror. In one implementation the arrangement comprises an ellipsoid, and in one particular implementation, the ellipsoid has a diameter greater than 500 mm. In one embodiment the plurality of substrates may comprises nine substrates. The act/step of securing the coating substrates may be accomplished by bonding and/or brazing.

In another aspect, an optic for use with EUV light is disclosed which may comprise a substrate; a smoothing layer selected from the group of materials consisting of Si, C, $Si_3N_4$, $B_4C$, SiC and Cr, the smoothing layer material being deposited using highly energetic deposition conditions; and a multilayer coating overlying the smoothing layer. The highly energetic deposition conditions may include substrate heating and/or increasing particle energy during deposition. In one embodiment the smoothing layer overlays and contacts the substrate and in one particular embodiment the substrate comprises SiC. By way of example, the smoothing layer may have a thickness in the range of 3 nm to 100 nm and may comprise an amorphous material. In one implementation, multilayer coating comprises alternating layers of Mo and Si and in one particular implementation, the optic is a collector mirror for an EUV light source.

In a particular aspect, a method for producing an optic for use with EUV light may comprise the steps/acts of providing a substrate; depositing a smoothing layer on the substrate; polishing the smoothing layer; and overlying a multilayer EUV coating the smoothing layer. In some cases, the method may further comprise the step of polishing the substrate. For example, the substrate may comprise SiC and the smoothing layer may comprise crystalline Si deposited to a thickness in the range of about 5 μm to 100 μm.

In one aspect of an embodiment, a method of fabricating a normal incidence, EUV light source mirror may comprise the steps/acts of providing a plurality of discrete substrates, at least one of the substrates fabricated by replication from a master pattern; coating each the substrate with a respective normal incidence EUV reflective multilayer coating; and securing the coated substrates together to form a single mirror. The substrate may comprise nickel, e.g., a nickel alloy. In one implementation, one or more (or in some cases all) of the substrates may be deformable, e.g., nickel alloy having a thickness in the range of about 0.5 mm to about 1.5 mm. In another implementation, one or more (or in some cases all) of the substrates may be rigid, e.g., nickel alloy having a thickness in the range of 3.5 mm to 6.5 mm. A plurality of the substrates may be fabricated by replication from a common master pattern, and in some cases, the substrates may be fabricated by an electroforming replication process.

For one aspect, an EUV light source mirror assembly may comprise a support structure and a plurality of discrete substrates with each substrate coated with a respective EUV reflective multilayer coating and at least one of the substrates may be moveably mounted on the support structure to allow adjustment of the substrate relative to the support structure. For example, the mirror assembly may include an actuator, e.g., an actuator having an electro-actuatable element, e.g., piezoelectric, for moveably mounting the substrate to the support structure. In one arrangement, the substrate may be deformable and activation of the actuator may deform the substrate. In another arrangement, the substrate may be rigid and activation of the actuator may translate the substrate relative to the support structure. The substrate may be mounted on a common support structure and the support structure may be made of a low coefficient of thermal expansion material such as si-carbon fiber composite, SiC, invar or stainless steel. In one embodiment, the mirror assembly may include a plurality of rings with at least one substrate mounted on at least one ring; and an actuator for moveably mounting at least one ring relative to the support structure. In a particular embodiment, at least one substrate is mounted on a plurality of rings and the substrate may be deformable.

Another aspect includes a method for fabricating and aligning a light source collector mirror that may comprise the steps/acts of providing a support structure; coating a plurality of discrete substrates with an EUV reflective multilayer coating; using an actuator to moveably mount at least one of the substrates to the support structure and activating the actuator to adjust at least one of the substrates relative to the support structure. In one implementation, the mirror may be an ellipsoidal mirror establishing first and second focal points and the method may further comprise the steps of directing light, e.g., light having a frequency in the visible spectrum, from the first focal point toward the mirror for measurement at the second focal point and using the measurement to activate the actuator and align the substrate. The activating step may be performed after installation of the mirror in a light source, e.g., in a plasma chamber of an LPP light source, and while the mirror is at elevated temperature.

In another aspect of an embodiment, normal incidence, EUV light source collector mirror for receiving light directly from an EUV light emitting plasma and producing a shaped beam for use with a system illuminating a lithography mask with an illumination field having a pre-selected shape, e.g., arc shaped, in a plane normal to the direction of light propagation is provided. The collector mirror may comprise a support structure and a plurality of facets, each facet having an outline shape, and wherein the pre-selected shape of the illumination field and the outline shape of the facet are substantially the same. For this aspect, each facet may comprise a rotationally symmetric reflective surface and the facets may be mounted on the support structure and aligned to direct bundles of light toward a plurality of focal spots. For example, the rotationally symmetric reflective surface may be an off-axis surface segment of a sphere, a surface segment of an asphere or an on-axis surface segment of a toroid. In one implementation, at least one facet is arc shaped and in a particular implementation, the mirror may comprise over 50 facets. Several arrangements are contemplated including an arrangement in which the facets are positioned in a generally ellipsoidal pattern, an arrangement in which the facets are positioned in a generally parabolic pattern and an arrangement in which the facets are positioned in a generally near-parabolic pattern. In one setup, a plurality of actuators are provided, with each actuator moveably mounting a respective facet to to the support structure.

In still another aspect of an embodiment, an optical arrangement for homogenizing and shaping light from an EUV light emitting plasma to a mask as an illumination field having a pre-selected shape, e.g., arc shaped, in a plane normal to the direction of light propagation is disclosed. The arrangement may comprise an EUV reflective mirror comprising a plurality of reflective surfaces and a normal incidence, EUV light source collector mirror for receiving light directly from the plasma, the collector mirror having a plurality of facets with each facet having an outline shape, and wherein the pre-selected shape of the illumination field and the outline shape of the facet are substantially the same. For this aspect, the arrangement may further comprise an EUV light condenser mirror. In one embodiment, the reflective surfaces of the EUV reflective mirror may be arranged in a generally planar pattern and in a particular embodiment, the facets of the collector mirror may comprise a rotationally symmetric reflective surface.

In another aspect, a corrosion resistant, multilayer coating for an EUV mirror may comprise a plurality of bi-layers with each bi-layer having a layer comprising Si and a layer comprising a compound material having nitrogen and a $5^{th}$ period transition metal (e.g., Y, Zr, Nb, Mo, Ru, Rh, Pd, Ag or Cd). In one embodiment, the $5^{th}$ period transition metal is selected from the group of metals consisting of Nb, Mo and Ru and in a particular embodiment, the compound material is a nitride, e.g., MoN, MoNbN or NbN.

DETAILED DESCRIPTION OF PREFERRED EMBODIMENTS

Figure 1:
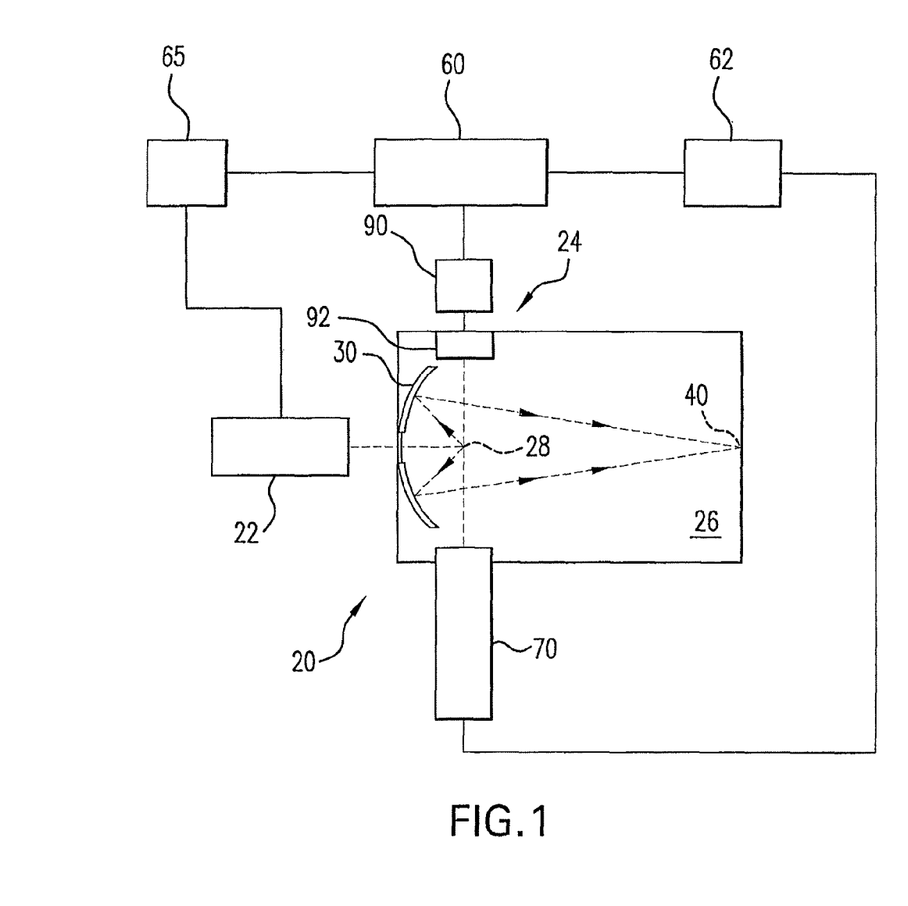
FIG. 1 shows a schematic view of an overall broad conception for a laser-produced plasma EUV light source.

With initial reference to FIG. 1 there is shown a schematic view of an exemplary EUV light source, e.g., a laser produced plasma EUV light source 20 according to one aspect of an embodiment. As shown, the LPP light source 20 may include a pulsed or continuous laser source 22, e.g., a pulsed gas discharge $CO_2$ laser source producing radiation at 10.6 μm, e.g. with DC or RF excitation operating at relatively high power and high pulse repetition rate. For example, a suitable $CO_2$ laser source having a MO-PA1-PA2-PA3 configuration is disclosed in U.S. patent application Ser. No. 11/174,299 filed on Jun. 29, 2005, now U.S. Pat. No. 7,439,530, issued on Oct. 21, 2008, and entitled, LPP EUV LIGHT SOURCE DRIVE LASER SYSTEM, the entire contents of which were previously incorporated by reference herein.

Depending on the application, other types of lasers may also be suitable. For example, a solid state laser, an excimer, a molecular fluorine laser, a MOPA configured excimer laser system, e.g., as shown in U.S. Pat. Nos. 6,625,191, 6,549,551, and 6,567,450, an excimer laser having a single chamber, an excimer laser having more than two chambers, e.g., an oscillator chamber and two amplifying chambers (with the amplifying chambers in parallel or in series), a master oscillator/power oscillator (MOPO) arrangement, a power oscillator/power amplifier (POPA) arrangement, or a solid state laser that seeds one or more $CO_2$, excimer or molecular fluorine amplifier or oscillator chambers, may be suitable. Other designs are possible.

As further shown in FIG. 1, the light source 20 may also include a source material delivery system 24, e.g., delivering droplets of a source material into the interior of a chamber 26 to a target volume 28 where the source material targets will be irradiated by one or more light pulses, e.g., a pre-pulse and thereafter a main pulse, to produce a plasma and generate an EUV emission. The source material may include, but is not limited to, a material that includes tin, lithium, xenon or combinations thereof. The EUV emitting element, e.g., tin, lithium, xenon, etc., may be in the form of liquid droplets and/or solid particles contained within liquid droplets or any other form that delivers the EUV emitting element to the target volume.

Continuing with FIG. 1, the light source 20 may also include a collector 30, e.g., a normal incidence reflector, e.g., in the form of a truncated ellipse, e.g., a multi-layer mirror having alternating layers of Molybdenum and Silicon, with an aperture to allow the light pulses generated by the source 22 to pass through and reach the target volume 28. The collector 30 may be, e.g., an elliptical mirror that has a first focus within or near the target volume 28 and a second focus at a so-called intermediate point 40 (also called the intermediate focus 40) where the EUV light may be output from the light source 20 and input to, e.g. an integrated circuit lithography tool (not shown).

The light source 20 may also include an EUV light source controller system 60, which may also include a firing control system 65 for triggering one or more lamps and/or laser sources in the source 22 to thereby generate light pulses for delivery into the chamber 26. In addition, the light source 20 may include a droplet position detection system which may include one or more droplet imagers 70 that provide an output indicative of the position of one or more droplets, e.g., relative to the target volume 28 and provide this output to a droplet position detection feedback system 62, which can, e.g., compute a droplet position and trajectory, from which a droplet error can be computed, e.g., on a droplet by droplet basis or on average. The droplet error may then be provided as an input to the light source controller 60, which can, e.g., provide a position, direction and timing correction signal to the source 22 to control a source timing circuit and/or to control a beam position and shaping system e.g., to change the location and/or focal power of the light pulses being delivered to the chamber 26.

As shown in FIG. 1, the light source 20 may include a droplet delivery control system 90, operable in response to a signal (which in some implementations may include the droplet error described above, or some quantity derived therefrom) from the system controller 60, to e.g., modify the release point of the source material from a droplet delivery mechanism 92 to correct for errors in the droplets arriving at the desired target volume 28.

Figure 2:
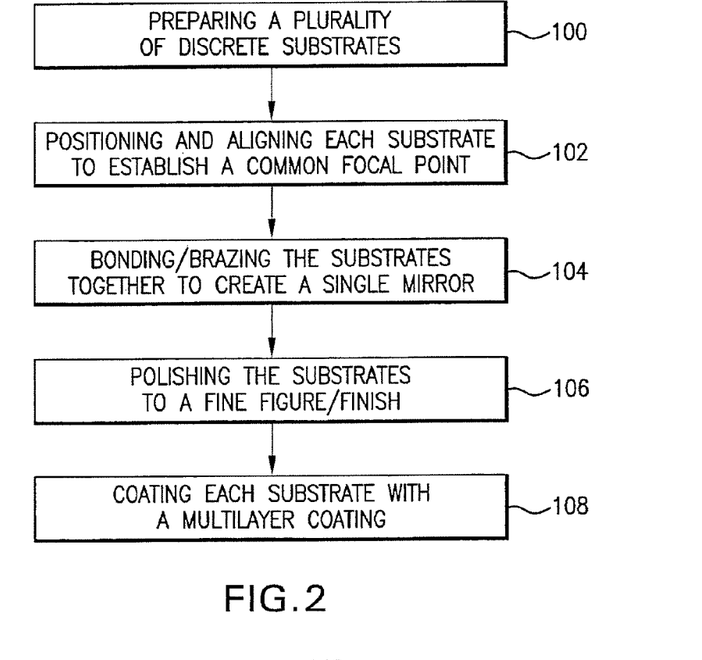
FIG. 2 shows a flow chart illustrating process steps/acts for fabricating an EUV light source mirror.
Figure 3:
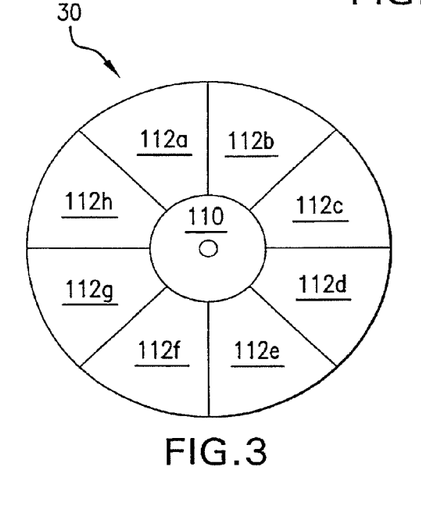
FIG. 3 shows a front view of an elliptical EUV collector mirror that has been fabricated by bonding/brazing nine coated substrates together.

FIG. 2 shows a flow chart illustrating process steps/acts for fabricating a relatively large EUV light source mirror such as the ellipsoidal mirror 30 shown in FIGS. 1 and 3. It is to be appreciated that the fabrication process shown is not necessarily limited to normal incidence mirrors, collector mirrors or mirrors having any particular shape, e.g., ellipsoidal, but instead may be used to produce other large EUV optics such as grazing incidence mirrors, including mirrors designed to reflect at incident angles greater than twenty degrees, spherical mirrors, aspherics, etc.

As shown in FIG. 2, a method of fabricating an EUV light source mirror may begin by preparing a plurality of discrete substrates (box 100). Next, as shown in FIG. 2, the substrates are then positioned in an arrangement which approximates the final, desired figure of the optical element (box 102). For example, for an ellipsoid collector mirror, each coated substrate may be positioned and tested to establish the first ellipsoid focus (e.g., point 28 in FIG. 1), the second ellipsoid focus (e.g. point 40 in FIG. 1), or both. Once a suitable arrangement is obtained, the substrates are secured together (box 104). The act/step of securing may be accomplished by bonding and/or brazing. Other fastening techniques, e.g., mechanical fasteners, may be used in lieu of bonding and/or brazing, or in addition thereto to secure the coated substrates together. After assembly, the substrates may be polished (as an assembly) to obtain the final figure and surface finish for the optic (box 106). Once polished, each substrate in the assembly may be coated with a multilayer coating such as a Mo/Si dielectric coating (box 108).

Cross referencing FIGS. 1 and 3, it can be seen that nine substrates 110, 112a-h, including a central ellipsoidal shaped substrate 110 and eight peripheral substrates 112a-h, may be arranged as a single, relatively large ellipsoid mirror 30, allowing, in some cases, an ellipsoid having a diameter, d, greater than 500 mm. Although an embodiment with nine substrates 110, 112a-h is shown, it is to be appreciated that more than nine and as few as two substrates may be joined together using the procedure described herein. For some applications, use of the above-described techniques may allow the use of single crystal silicon to create mirrors sizes that would be otherwise technically and/or economically unfeasible, however, nothing in this disclosure should be interpreted to limit the fabrication method to any specific type of substrate material or size.

Figure 4:
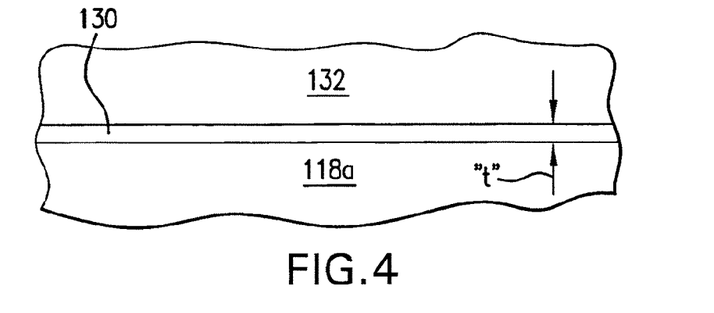
FIG. 4 is an enlarged sectional view of an EUV optic illustrating a smoothing layer.
Figure 5:
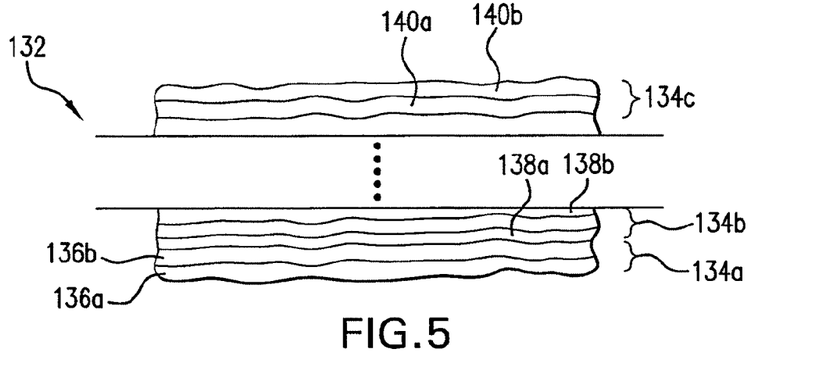
FIG. 5 is an enlarged, not to scale, sectional view of a multilayer system.

FIGS. 4 and 5 illustrate a coating for an optical element substrate, such as a collector mirror 30 shown in FIG. 1. As described herein, the coatings and coating processes illustrated in FIGS. 4 and 5 may be used on multi-substrate mirrors such as the mirror 30 shown in FIGS. 1 and 3, single substrate, e.g., monolithic mirrors, normal incidence mirrors such as collector mirrors, grazing incidence mirrors (e.g. low angle (<20 degrees) grazing incidence mirrors which typically use metallic coatings, e.g., Ruthenium, and high angle (20-40 degrees) grazing incidence mirrors which typically use multilayer coatings, e.g., dielectric multilayer coatings, e.g., Mo/Si multilayer coatings. In addition, the coatings and coating processes illustrated in FIGS. 4 and 5 may be used on any other EUV optics that are coated with a multi-layer coating.

Beginning with FIG. 4, for use with 13 nm light, the substrate 118a may be made of silicon including single crystal and polycrystalline material, glidcop, float glass, ULE glass (ultra-low expansion glass), Zerodur, fused silica, aluminum, beryllium, molybdenum, copper, nickel or nickel alloy, silicon carbide including high density SiC and other densities, SiC produced by various techniques such as CVD SiC, CVC SiC, reaction-bonded SiC, and other composites containing SiC or other suitable substrate materials that are known or become known in the pertinent art. The coating may include a layer 130 which may be a so-called smoothing layer that is deposited on the substrate 118a to overlay and contact a surface of the substrate, as shown. FIG. 4 shows that the coating may further include a multilayer system 132 overlaying the layer 130. As used herein, the term "smoothing layer" and its derivatives, includes, but is not necessarily limited to a layer which promotes a smooth finish in subsequently applied layers which overlay the smoothing layer and may perform this function by creating a smooth surface for the subsequent layer(s), including the topcoat, that are overlaid on the smoothing layer, the smooth surface of the smoothing layer being created either as-deposited or after subsequent operations, e.g., polishing, etc.

In particular, the use of smoothing layer(s) may be suitable on optics which may be difficult to polish, e.g., aspherical optics, however, they may also have application for other optics, e.g., flat optics and spherical optics. The smoothing layer may also be applied to smoothen and improve the surface conditions of a used EUV optic (that may have suffered erosion, debris deposition, contamination, etc.) before it is re-coated with a multilayer coating.

In one embodiment, the layer 130 may include a smoothing layer material such as Si, C, $Si_3N_4$, $B_4C$, SiC, Cr, $CrSi_2$, $MoC_2$ or $MoSi_2$ that has been deposited using highly energetic deposition conditions. The highly energetic deposition conditions may include substrate heating and/or depositing the material using increased particle energy, as compared to standard deposition techniques. As used herein, the term "particle" and its derivatives includes, but is not limited to ions and neutrals of a particular chemical element or molecule. For example, the substrate may be heated to a temperature in the range of about 100 to 200 degrees C.

The high energy supplied during deposition (either by substrate heating or by increasing the energies of ions and neutrals during deposition) may increase the atomic mobility on the surface during deposition which in turn may lead to a smoothening. Typical ion energies may be in the range of several 100 eV to a few 1000 eV. A grazing ion incidence angle may be used to obtain a smooth surface through ion polishing. In some cases, it may be advantageous to first treat the surface by ion bombardment for some length of time before the smoothing layer is deposited. This may lead to the elimination of the roughest features on the substrate surface before the application of the smoothing layer.

Although FIG. 4 shows a single smoothing layer 130, the disclosure provided herein is not limited to a single smoothing layer deposited during a single continuous deposition process. Instead, multiple smoothing layers may be applied, differing in smoothing material and/or time of deposition and other processing steps may be performed, e.g., polishing, etc. between depositions. For example, smoothing layers can be applied followed by ion bombardment polishing and subsequent application of another smoothing layer. Each layer may be applied with a different duration. Also, different energies of ion bombardment with argon ions or other sputter ions may be used during or between deposition periods.

The layer 30 may be deposited using deposition techniques known in the pertinent art such as, but not limited to, physical vapor deposition by thermal source or electron beam, or ion assisted deposition. Prior to deposition of the layer 130, the substrate may be cleaned using one or more of the following techniques to include ultrasonic aqueous cleaning and/or solvent cleaning, for example using high purity Methanol or some other suitable solvent. In some cases, and for some materials, e.g. carbon and Silicon Nitride, the layer 130 may be deposited to a thickness "t" below a critical thickness in which crystallization occurs to obtain a substantially amorphous coating. 12. For some embodiments, the smoothing layer may have a thickness in the range of 3 nm to 100 nm. The thickness used will typically dependent on the materials used (e.g. substrate and smoothing material). For example, for Si, a thickness of 5-20 nm may be used, and for chromium, a thickness of 20-40 nm may be used.

In some cases, a high degree of substrate smoothing may be provided through amorphous layer growth initiated through multivalent chemical bonds with surface atoms during sufficiently energetic deposition conditions. Thus, in addition to carbon (C) and silicon (Si), thin layers of carbon or silicon containing compounds like SiC, $B_4C$, $Si_3N_4$ may be suitable. Chromium or $CrSi_2$ may also form a good smoothing layer due to its growth properties, e.g., 20 nm-40 nm thick amorphous layers of chromium can be grown for a wide range of deposition parameters.

FIG. 5 illustrates in greater detail a multilayer system 132 that may be deposited on layer 130 shown in FIG. 4. As shown there, the multilayer system 132 may include plurality of bi-layers 134a, 134b, 134c, which may or may not be graded across the face of the mirror. For the multilayer system 132, each bi-layer may include a layer of a first dielectric material having an index of refraction, $n_1$, and a layer of a second dielectric material having an index of refraction, $n_2$, with $n_1 \neq n_2$. For example, for the system 132 shown, the bi-layer 134a may have a layer 136a of Molybdenum (Mo) and a layer 136b of silicon (Si), the bi-layer 134b may have a layer 138a of Mo and a layer 138b of Si, and the bi-layer 134c may have a layer 140a of Mo and a layer 140b of Si. In some designs, each layer of the multilayer system 132 may have a layer thickness which may be approximately $\lambda/4$, (and in some cases $\lambda/2$) where $\lambda$ is a selected center wavelength for light illuminating the optic, e.g., 13 nm. Each layer of the multilayer system 132 may be deposited using one of the techniques described above.

Figure 5A:
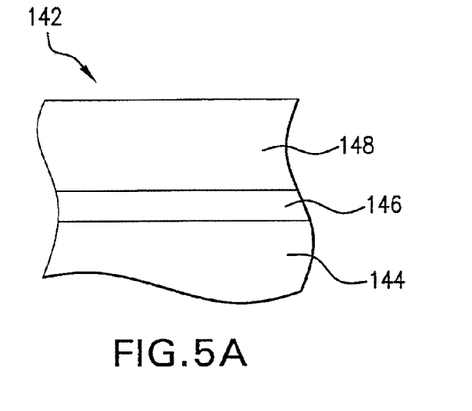
FIG. 5A is an enlarged, not to scale, sectional view of an alternative embodiment of an MLM mirror having a relatively thick smoothing layer.

FIG. 5A illustrates an alternative embodiment of an MLM mirror 142 having a smooth surface finish. For this embodiment, a substrate 144, which may be, for example, SiC is first prepared, and in some cases polished. Then, a relatively thick smoothing layer 146, e.g., crystalline Si at a thickness in the range of about 5 μm to 100 μm, and in some cases about 10 μm to 25 μm, is deposited. The smoothing layer can be deposited using e-beam evaporation, and typically, the energetic conditions described above may not be necessary. The smoothing layer can then be polished, e.g., using atomic polishing, and then coated with a multi-layer coating 148, as shown.

Figure 6:
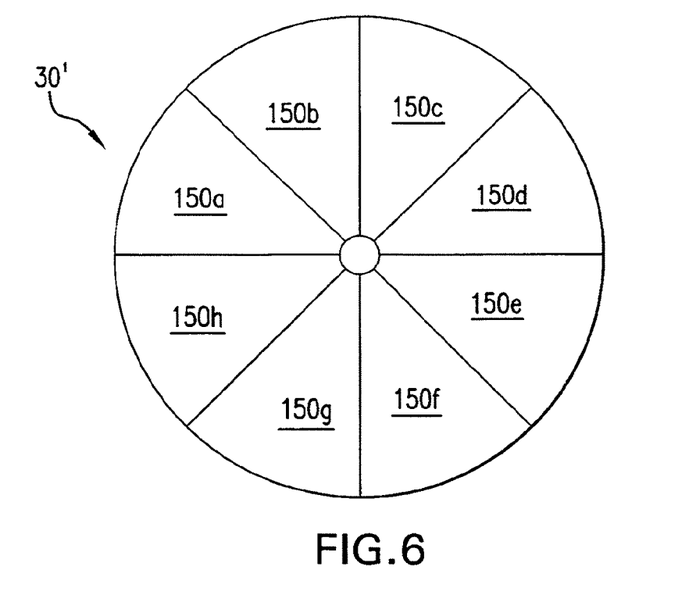
FIG. 6 shows a front view of an elliptical, normal incidence, EUV collector mirror that has been fabricated by securing eight identically shaped coated substrates together.

FIG. 6 shows a front view of an elliptical, normal incidence, EUV collector mirror that has been fabricated by securing together eight identically shaped coated substrates 150a-h, e.g., substrates coated with EUV normal incidence, multilayer coatings. For the mirror shown in FIG. 6, each substrate 150a-h may be fabricated by replication from a master pattern. For example, this replication may be performed using an electroforming replication process, wherein a material, e.g., a nickel alloy is deposited, e.g., by galvanic deposition, onto the master pattern and thereafter separated, e.g., using thermal separation techniques, e.g., taking advantage of the coefficient of thermal expansion difference between the nickel alloy and the pattern material. Using this process, substrates of nickel alloy having a thickness in the range of about 0.5 mm to about 1.5 mm may be obtained to produce deformable substrates and substrates of nickel alloy having a thickness in the range of 3.5 mm to 6.5 mm may be obtained to produce a relatively rigid substrate. Replication from a common master pattern may result in a relatively inexpensive production technique for producing relatively large EUV mirrors. Although eight substrates 150 a-h are used for the mirror shown in FIG. 6, it is to be appreciated that the replication technique disclosed here can be used to produce mirrors having more than eight and as few as one substrates, (e.g., to produce multiple mirrors) and that the technique may be used to produce mirrors having some identical substrates and some non-identical substrates (such as the mirror shown in FIG. 3).

Figures 7, 8:
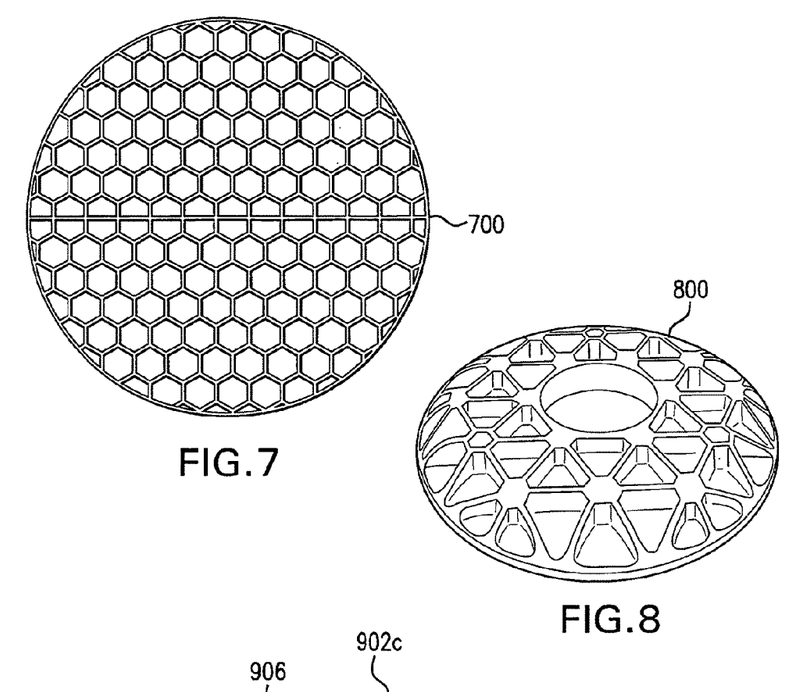
FIG. 7 shows an example of a monolithic, honeycomb support structure for a collector mirror.
FIG. 8 shows an example of a monolithic, equilateral triangular rib, support structure for a collector mirror.

Multiple substrates, such as the substrates 150a-h shown in FIG. 6 may be secured together by bonding, brazing and/or mechanical fastening, e.g., bolting. For example, the substrates 150a-h may be secured to a common, e.g., monolithic, support structure such as the honeycomb support structure 700 shown in FIG. 7 or the equilateral triangular rib structure 800 shown in FIG. 8. For the nickel alloy replicated substrates, it may be desirable to fabricate the support structure of a nickel alloy to facilitate brazing and so that the substrates and support structure have similar or identical coefficients of thermal expansion. Other suitable materials for the support structure may include low coefficient of thermal expansion materials such as Si-carbon fiber composite, SiC, invar or stainless steel.

Figure 9:
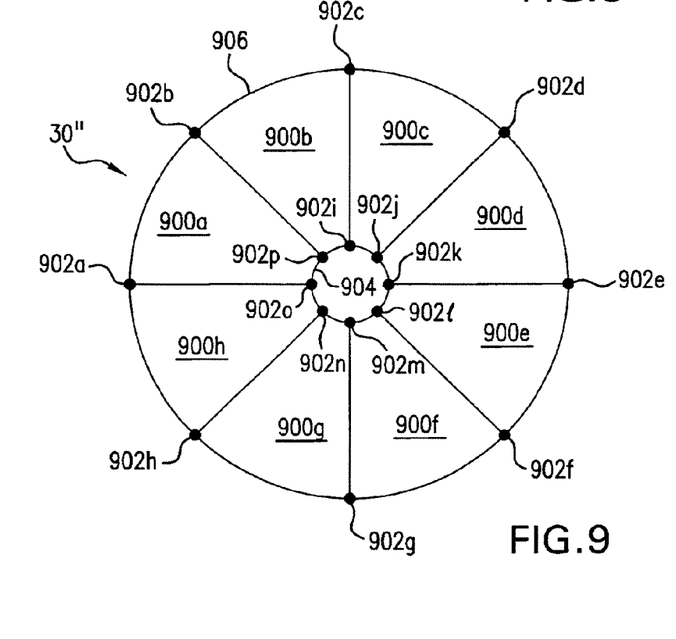
FIG. 9 illustrates a collector mirror wherein multiple coated substrates may be moveably mounted on a support structure to allow adjustment of each substrate relative to a support structure using actuators.

FIG. 9 illustrates an embodiment of a collector mirror 30″ wherein multiple substrates 900a-h may be moveably mounted on a support structure to allow adjustment of each substrate 900a-h relative to the support structure via actuators 902a-p. For the embodiment shown, the support structure can include a plurality of rings 904, 906 with the corners of each substrate 900a-h attached to an actuator 902a-p, which in turn is attached to one of the rings 904, 906. In another arrangement, the substrates may be rigidly attached to the rings, which are then moveable attached, via one or more respective actuators to a support structure such as one of the structures shown in FIG. 7 or 8. In yet another arrangement, the substrates may be moveable attached, via one or more respective actuators to a support structure, (i.e., without rings) such as one of the structures shown in FIG. 7 or 8.

For the collector mirror 30″, the actuators 902a-p may have an electro-actuatable element, e.g., piezoelectric, for moveably mounting the substrate to the support structure. As used herein, the term "electroactuatable element" and its derivatives, means a material or structure which undergoes a dimensional change when subjected to a voltage, electric field, magnetic field, or combinations thereof and includes but is not limited to piezoelectric materials, electrostrictive materials and magnetostrictive materials.

As indicated above, each substrate 900a-h may be deformable and activation of one of the actuators 902a-p may deform the substrate. In another arrangement, each substrate 900a-h may be rigid and activation of one or more of the actuators 902a-p may translate a substrate 900a-h relative to the support structure. In some cases, the adjustment of the substrates 900a-h via actuators 902a-p may be performed after installation of the mirror 30″ in a light source, e.g. in a plasma chamber of an LPP light source, and while the mirror 30″ is at elevated temperature and/or under high vacuum. For this case, the actuators may be made using a high temperature, piezoelectric material, e.g., a piezoelectric rated for 150 degree C. service.

A procedure for fabricating and aligning a light source collector mirror may be described with cross-reference to FIGS. 1 and 9. As shown in FIG. 1, the ellipsoidal mirror establishes a first focal point 28 and a second focal point 40, which may be used to align the collector mirror 30 and/or one or more of the individual substrates making up the collector mirror. Thus, the procedure may be employed for a mirror having a one-piece, e.g., monolithic substrate, multiple substrates secured together to form a rigid construction, or multiple substrates that are adjustably moveable relative to a support structure/rings and/or to each other.

For the procedure, a source of light may be positioned inside the plasma chamber and oriented to direct light, e.g., light having a frequency in the visible spectrum, from the first focal point, e.g., point 28 toward the mirror 30 for measurement at the second focal point, e.g., point 40. This measurement may then be used to selectively activate one or more of the actuators 902a-p and align the one or more of the substrates 900a-h. The measurement and activation steps may be performed after installation of the mirror 30 in a light source, e.g., in a plasma chamber of an LPP light source, and while the mirror 30 is at elevated temperature and/or under high vacuum.

Figure 10:
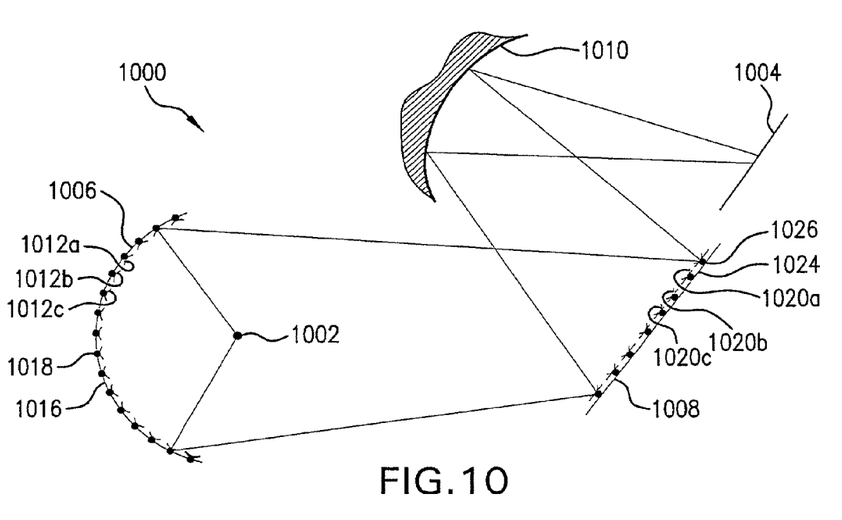
FIG. 10 shows a schematic of an optical arrangement for homogenizing and shaping light from an EUV light emitting plasma to a mask as an arc-shaped illumination field.
Figure 14:
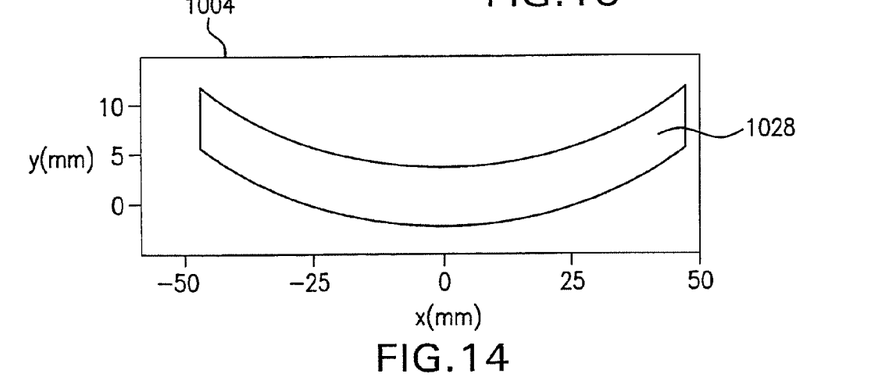
FIG. 14 shows an example of a dimensioned, arc shaped illumination field suitable for irradiating an EUV photomask/reticle.

FIG. 10 illustrates an optical arrangement (designated generally 1000) for collecting and/or homogenizing and/or shaping light from an EUV light emitting plasma 1002 to a plane 1004, e.g., mask plane, as a shaped, e.g., arc shaped or rectangular shaped, illumination field, i.e., a beam having preselected shape, e.g., to arc or rectangular, in a plane normal to the general propagation direction (see also FIG. 14). As shown, the arrangement 1000 may include an EUV light source collector mirror 1006, an EUV reflective mirror 1008, e.g. a pupil mirror, and a condenser mirror 1010. Generally, as shown, a portion of the light from the plasma 1002 first reaches the collector mirror 1006 where it is reflected and directed to the mirror 1008 where it is reflected and directed to the condenser mirror 1010 where it is reflected and directed to the plane 1004.

Figure 11:
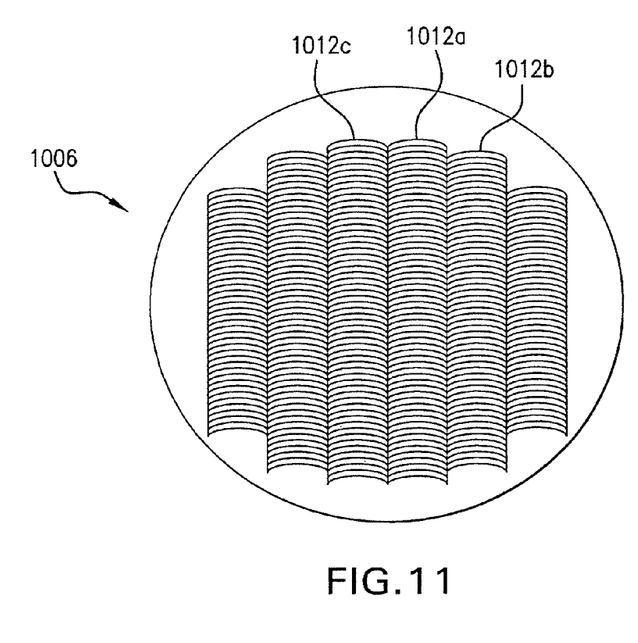
FIG. 11 shows a front view of a multi-faceted collector mirror for use in the arrangement shown in FIG. 10.

Cross-referencing FIGS. 10 and 11, it can be seen that the collector mirror 1006 may include plurality of individual facets, of which facets 1012a-c have been labeled with reference numerals. Although several hundred facets are shown in FIG. 11, it is to be appreciated that more than several hundred and as few as two facets may be used in the collector mirror 1006. More particularly, it is contemplated that about 50 to 1000 facets may be used.

Figure 12:
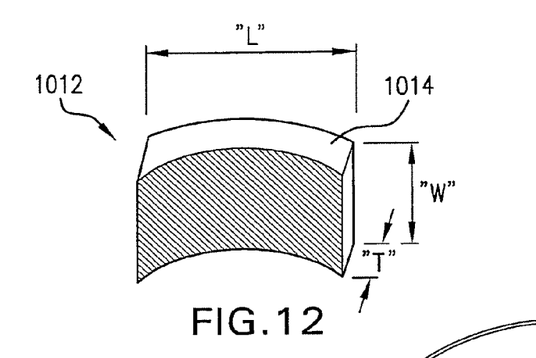
FIG. 12 shows a perspective view a mirror facet for use in the collector mirror shown in FIG. 11.

FIG. 12 shows an example of a facet 1012 for use in the collector mirror 1006. For the collector mirror 1006, one or more of the facets 1012 may have a reflective surface 1014 having an outline shape (which for the facet shown in FIG. 12 is arc-shaped) that is substantially the same shape as the selected shape of the illumination field, i.e., the shape in a plane normal to the direction of light propagation at the lithography mask. Thus, for an arc-field lithography tool, the facets 1012 may have an outline shape that is arc shaped, for a rectangular field lithography tool, the facets 1012 may have an outline shape that is rectangular shaped, etc.

Use of a mirror pair downstream of an EUV light source having a multi-faceted mirror with arc shaped facets to produce an arc field has been previously disclosed in an article titled "FABRICATION OF A COMPLEX-SHAPED MIRROR FOR AN EXTREME ULTRAVIOLET LITHOGRAPH ILLUMINATION SYSTEM" written by Takino et al. and published in Opt. Eng. 42(9) in September 2003 and in "NOVEL ILLUMINATION SYSTEM FOR EUVL" written by Komatsuda and published in Proc. SPIE 3997, 765-776 (2000), both of which are hereby incorporated by reference herein.

For the arrangement 1000, each facet 1012 may have a concave rotationally symmetric reflective surface 1014, e.g., an off-axis surface segment of a sphere, a surface segment of an asphere or an on-axis surface segment of a toroid. Further, each facet 1012 may be coated with a normal incidence EUV reflective coating, e.g., multi-layer dielectric coating, e.g., Mo/Si coating. More than one, and in some implementations all, of the collector mirror facets may be identical. Also, more than one, and in some cases all, of the collector mirror facets may be manufactured using a replication process as described above, or can be cut, lapped and polished pieces. By way of example, and not limitation, each facet 1012 may be rectangular and arc shaped as shown in FIG. 12 and may have a length "L" of about 40 mm, a width "W" of about 10 mm and a thickness "T" of about 1 mm. With this shape, a fill factor of about 90% may be achieved.

FIG. 10 illustrates that the facets 1012a-c may be mounted on a support structure 1016 and arranged in a pattern, e.g., periodic pattern which may be, for example, generally ellipsoidal, generally parabolic or generally near-parabolic pattern. Within the general pattern, each facet 1012a-c may be aligned, individually to direct a bundle of light toward a particular spot, thus, the alignment may be non-uniform from facet 1012 to facet 1012.

In one setup, actuators 1018 may be provided, e.g., an actuator having an electro-actuatable element, e.g., piezoelectric, with one or more actuators moveably mounting a respective facet to the support structure e.g. two actuators may be provided to provide two axis, e.g. tip-tilt control. Alternatively, an arrangement may be provided (not shown) in which one actuator may move one or more facets. The actuators may be utilized to align the facets 1012 prior to operation of the light source/lithography tool and/or during operation and may be operated in response to a control signal, e.g., generated by an optical detector, e.g., photodetector array, wavefront sensor, etc.

Figure 13:
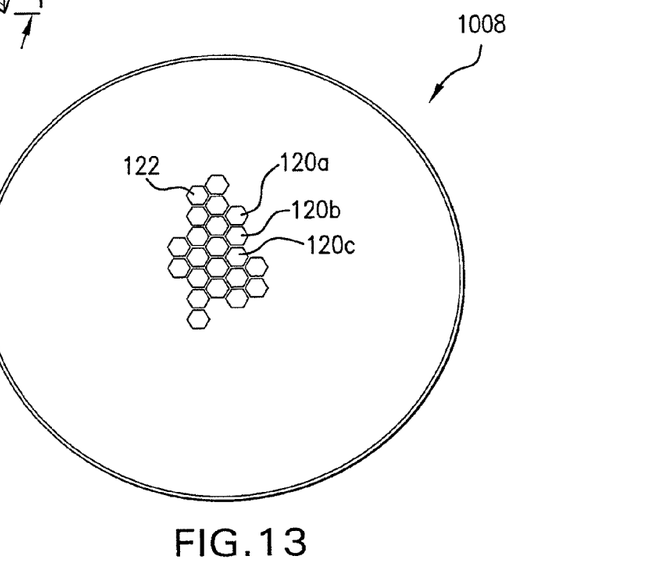
FIG. 13 shows a front view of a multi-faceted pupil mirror for use in the arrangement shown in FIG. 10.

A better understanding of the mirror 1008, e.g. pupil mirror, can be obtained with cross-reference to FIGS. 10 and 13. As shown the mirror 1008 may include plurality of individual facets, of which facets 1020a-c have been labeled with reference numerals. Although only a portion, e.g., about twenty facets, are shown in FIG. 13, it is to be appreciated that the entire operable surface of the mirror 1008 may be covered with facets 1020.

FIG. 13 shows that the facets 1020 may be hexagonal shaped and placed in an arrangement which fills space to reduce intensity loss. Each facet 1020 may be coated with a normal incidence EUV reflective coating, e.g., multi-layer dielectric coating, e.g., Mo/Si coating. More than one, and in some implementations all, of the facets 120 may be identical. Also, more than one, and in some cases all, of the mirror facets 1020 may be manufactured using a replication process as described above, or can be cut, lapped and polished pieces. By way of example, and not limitation, each facet 1020 may be hexagonal shaped as shown in FIG. 12 and may have a width of about 10-30 mm.

FIG. 10 illustrates that the facets 1020a-c may be mounted on a support structure 1024 and arranged in a pattern, e.g., periodic pattern which may be, for example, planar, as shown. Within the general pattern, each facet 1020a-c may be aligned, individually to direct a bundle of light toward a particular spot on the condenser mirror 1010, thus, the alignment may be non-uniform from facet 1020 to facet 1020.

In one setup, actuators 1026 may be provided, e.g. an actuator having an electro-actuatable element, e.g., piezo-electric, with one or more actuators moveably mounting a respective facet to the support structure, e.g. two actuators may be provided to provide two axis, e.g., tip-tilt control. Alternatively, an arrangement may be provided (not shown) in which one actuator may move one or more facets 1020. The actuators may be utilized to align the facets 1020 prior to operation of the light source/lithography tool and/or during operation and may be operated in response to a control signal, e.g., generated by an optical detector, e.g., photodetector array, wavefront sensor, etc.

From the multi-faceted mirror 1008, light may be condensed by condenser mirror 1010 onto plane 1004 as shown in FIG. 10. For example mirror 1010 may be a concave, EUV normal incidence mirror, e.g., having a multi-layer dielectric coating, e.g., Mo/Si coating. FIG. 14 illustrates a dimensioned, arc shaped illumination field 1028 at the plane 1004, e.g., photomask/reticle plane.

Figure 15:
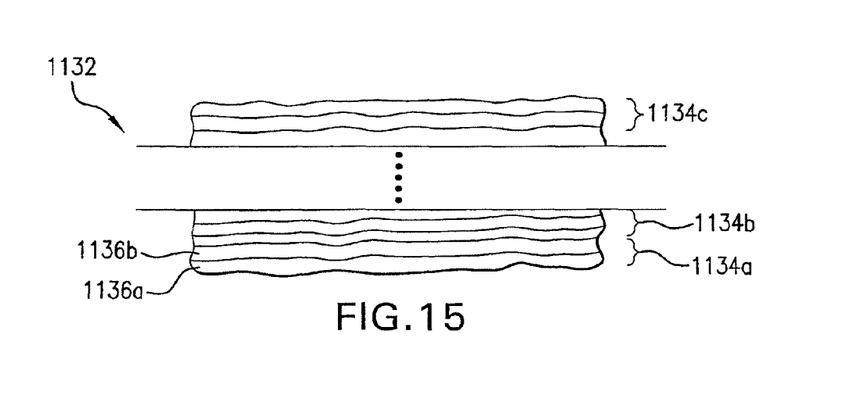
FIG. 15 is an enlarged, not to scale, sectional view of a corrosion resistant multilayer mirror.

FIG. 15 illustrates in greater detail a multilayer system 1132 that may be to deposited on a substrate 118*a* and/or layer 130 (see FIG. 4). As shown in FIG. 15, the multilayer system 1132 may include plurality of bi-layers 1134*a*, 1134*b*, 1134*c*, which may or may not be graded across the face of the mirror. For the multilayer system 1132, each bi-layer may include a layer of a first dielectric material having an index of refraction, $n_1$, and a layer of a second dielectric material having an index of refraction, $n_2$, with $n_1 \neq n_2$ For example, for the system 1132 shown, the bi-layer 1134*a* may have a layer 1136*a* including a compound material having nitrogen and one or more $5^{th}$ period transition metals (e.g., Y, Zr, Nb, Mo, Ru, Rh, Pd, Ag and Cd) and a layer 1136*b* of silicon (Si). In particular, nitrogen compounds of Y, Zr, Nb, Mo, Ru, Rh, Pd (and their alloys) show relatively good reflectivity for light with a wavelength between 13 nm and 14 nm.

These corrosion resistant, EUV-reflective, multilayer coatings may be used in environments which tend to oxidize inferior materials. In general, oxide layers may lead to relatively large absorption of EUV light, e.g., light around 13.5 nm wavelength and may cause to coating to degrade. Thus, in most cases, if oxidation can be avoided, a higher reflectance of the mirror can be sustained and a longer mirror lifetime may be expected. One source of oxidation may arise due to the relatively high water vapor content that is typically present in the plasma vacuum chamber and/or the coating may be exposed to oxygen contact when the chamber is vented. When debris mitigation etchants, e.g., HBr gas, are employed, the silicon layers may be etched away more rapidly than the other bi-layer material (e.g., Mo, for a standard Mo/Si MLM) allowing molybdenum oxide layers to form on the top of the multilayer coating. Also, it is possible that over time, several layers may be etched away by ion bombardment from the plasma and/or by etching, e.g., from an HBr cleaning gas.

In general, transition metal nitrides, e.g., $TM_xN_y$, are more resistant to oxidation than their pure transition metal. In addition, layer intermixing tends to be relatively low for the nitride. Therefore, MLM coatings having transition metal nitrides may also have improved high-temperature stability. Although some transition metal nitrides, e.g., MoN, absorbs more strongly at 13.5 nm than their pure transition metal e.g., Mo, the reflectivity may still be suitable. By using a to plurality of bi-layers, and in some cases, all bi-layers having transition metal nitrides, sacrificial layers may be etched by plasma ion bombardment or halogen-containing cleaning gas while maintaining an corrosion resistant surface.

In some designs, each layer of the multilayer system 1132 may have a layer thickness which may be approximately $\lambda/4$, (and in some cases $\lambda/2$) where $\lambda$ is a selected center wavelength for light illuminating the optic, e.g., 13.5 nm. Each layer of the multilayer system 132 may be deposited using one of the techniques described above. In some implementations, the nitridation may be introduced during deposition by the admixture of nitrogen to the sputter gas (i.e., by reactive sputtering). For this implementation, the degree of nitridation may be varied and the total nitrogen content of the layers can be reduced below a 1:1 stoichiometric nitrogen content. This may increase the reflectivity due to the reduction of nitrogen absorbers. It may also be possible to use an MoRu alloy target instead of pure Mo or pure Ru. In this case MoRuN is formed ($Mo_xRu_yN_z$). Of the relevant transition metals, ruthenium is particularly resistant to oxidation. Therefore, a lower degree of nitridation may be applied when Ru or Ru-containing alloys are used for the transition metal layer.

Figure 16:
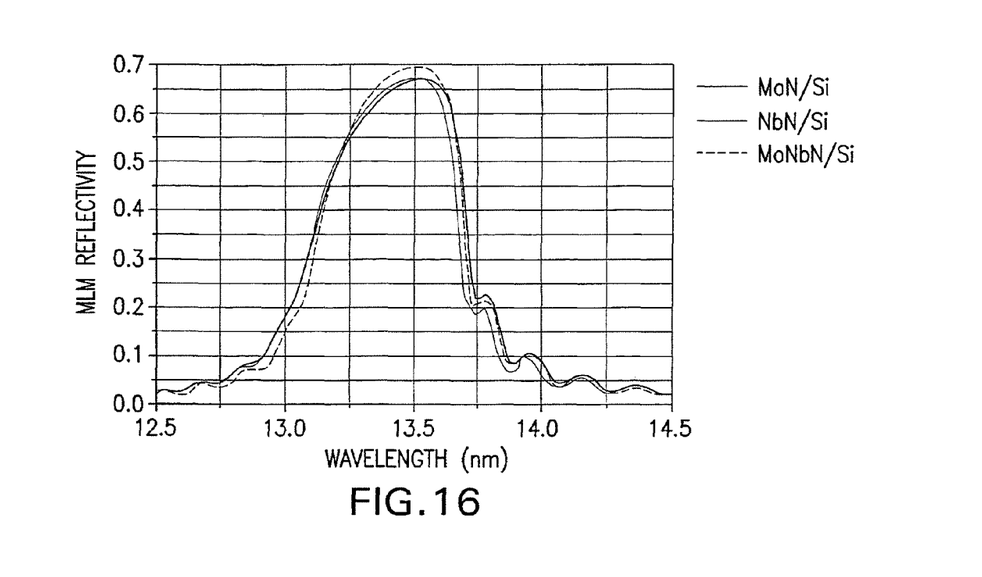
FIG. 16 shows calculated reflectivities for multilayer mirrors having MoN/Si bi-layers, NbN/Si bilayers and MoNbN/silicon bi-layers.

FIG. 16 shows calculated reflectivities for multilayer mirrors having MoN/Si bi-layers, NbN/Si bilayers and MoNbN/silicon bi-layers. RuN and RhN layers (not shown) give slightly lower peak reflectivities. For the calculation, a layer ratio of 0.4 was used and the number of layers used was 60. Interface roughness is not taken into account. The layer period for MoN was 6.90 nm, for NbN it was 6.88 nm and for MoNbN it was 6.89 nm. For MoNb, a 1:1 alloy mixture was assumed. As shown, the calculated peak reflectivity is in the range of about 67 to 69%, however, the achievable reflectivity values will typically be lower, e.g., around 55% due to the finite layer roughness.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the present invention(s) noted above, others could be implemented.

While the particular aspects of embodiment(s) of the EUV OPTICS described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present EUV OPTICS is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, to regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also be those skilled in the art that, in fulfillment of the patent statutes of the United States, applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, applicant(s) has disclosed only a single enabling example of any such aspect/feature/element of an embodiment or of any embodiment of the subject matter of what is claimed. Unless expressly and specifically so stated in the present application or the prosecution of this application, that applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

We claim:

1. A normal incidence, EUV light source collector mirror for receiving light directly from an EUV light emitting plasma and producing a shaped beam for use with a system illuminating a lithography mask with an illumination field having a pre-selected shape in a plane normal to the direction of light propagation, said mirror comprising:
  a support structure;
  a plurality of facets, each facet having an outline shape, and wherein the preselected shape of the illumination field and the outline shape of the facet are substantially the same.

2. A collector mirror as recited in claim 1 wherein the facets are shaped as arcs.

3. A collector mirror as recited in claim 1 wherein said mirror comprises over 50 facets.

4. A collector mirror as recited in claim 1 wherein the facets are positioned in a generally ellipsoidal pattern.

5. A collector mirror as recited in claim 1 wherein the facets are positioned in a generally parabolic pattern.

6. A collector mirror as recited in claim 1 wherein the facets are positioned in a generally near-parabolic pattern.

7. A collector mirror as recited in claim 1 further comprising a plurality of actuators, each actuator moveably mounting a respective facet to the support structure.

8. A collector mirror as recited in claim 1 wherein at least one facet comprises an off-axis surface segment of a sphere.

9. A collector mirror as recited in claim 1 wherein at least one facet comprises a surface segment of an asphere.

10. A collector mirror as recited in claim 1 wherein at least one facet comprises an on-axis surface segment of a toroid.

11. An optical arrangement for homogenizing and shaping light from an EUV light emitting plasma to a mask as an illumination field having a pre-selected shape in a plane normal to the direction of light propagation, the arrangement comprising:

an EUV reflective mirror comprising a plurality of reflective surfaces;

a normal incidence, EUV light source collector mirror for receiving light directly from the plasma, the collector mirror having a plurality of facets with each facet having an outline shape, and wherein the pre-selected shape of the illumination field and the outline shape of the facet are substantially the same.

12. An arrangement as recited in claim 11 further comprising an EUV light condenser mirror.

13. An arrangement as recited in claim 11 wherein said reflective surfaces of said EUV reflective mirror are arranged in a generally planar pattern.

14. An arrangement as recited in claim 11 wherein said facets of said collector mirror comprise a rotationally symmetric reflective surface.

15. An arrangement as recited in claim 11 wherein the facet outline is arc shaped.

16. A normal incidence, EUV light source collector mirror as recited in claim 1 wherein each of said facets comprises:
a substrate;
a smoothing layer selected from the group of materials consisting of Si, $Si_3N_4$, $B_4C$, SiC and Cr, said smoothing layer material being deposited using highly energetic deposition conditions overlying said substrate; and
a multilayer EUV coating overlying said smoothing layer.

17. A normal incidence, EUV light source collector mirror as recited in claim 16 wherein said deposition conditions include substrate heating.

18. A normal incidence, EUV light source collector mirror as recited in claim 16 wherein said deposition conditions include increasing particle energy during deposition.

19. A normal incidence, EUV light source collector mirror as recited in claim 16 wherein said substrate comprises SiC.

20. A normal incidence, EUV light source collector mirror as recited in claim 16 wherein said smoothing layer overlays and contacts said substrate.

21. A normal incidence, EUV light source collector mirror as recited in claim 16 wherein said multilayer coating comprises alternating layers of Mo and Si.

22. A normal incidence, EUV light source collector mirror as recited in claim 16 wherein said smoothing layer has a thickness in the range of 3 nm to 100 nm.

23. A normal incidence, EUV light source collector mirror as recited in claim 16 wherein said smoothing layer comprises an amorphous material.

24. An optical arrangement as recited in claim 11 wherein each of said facets comprises:
a substrate;
a smoothing layer selected from the group of materials consisting of Si, $Si_3N_4$, $B_4C$, SiC and Cr, said smoothing layer material being deposited using highly energetic deposition conditions overlying said substrate; and
a multilayer EUV coating overlying said smoothing layer.

25. An optical arrangement as recited in claim 24 wherein said deposition conditions include substrate heating.

26. An optical arrangement as recited in claim 24 wherein said deposition conditions include increasing particle energy during deposition.

27. An optical arrangement as recited in claim 24 wherein said substrate comprises SiC.

28. An optical arrangement as recited in claim 24 wherein said smoothing layer overlays and contacts said substrate.

29. An optical arrangement as recited in claim 24 wherein said multilayer coating comprises alternating layers of Mo and Si.

30. An optical arrangement as recited in claim 24 wherein said smoothing layer has a thickness in the range of 3 nm to 100 nm.

31. An optical arrangement as recited in claim 24 wherein said smoothing layer comprises an amorphous material.

\* \* \* \* \*